US012025679B2

(12) United States Patent
Guzman-Casillas et al.

(10) Patent No.: US 12,025,679 B2
(45) Date of Patent: Jul. 2, 2024

(54) INTEGRATING MEMORY DROPOUT TIMER

(71) Applicant: Schweitzer Engineering Laboratories, Inc., Pullman, WA (US)

(72) Inventors: Armando Guzman-Casillas, Pullman, WA (US); Peter S. LaDow, Pullman, WA (US)

(73) Assignee: Schweitzer Engineering Laboratories, Inc, Pullman, WA (US)

( * ) Notice: Subject to any disclaimer, the term of this patent is extended or adjusted under 35 U.S.C. 154(b) by 475 days.

(21) Appl. No.: 17/458,849

(22) Filed: Aug. 27, 2021

(65) Prior Publication Data

US 2022/0065949 A1    Mar. 3, 2022

Related U.S. Application Data

(60) Provisional application No. 63/071,444, filed on Aug. 28, 2020.

(51) Int. Cl.
| | |
|---|---|
| *H02H 7/00* | (2006.01) |
| *G01R 31/40* | (2020.01) |
| *G01R 31/58* | (2020.01) |
| *H02H 3/093* | (2006.01) |
| *H02H 7/26* | (2006.01) |
| *G01R 31/08* | (2020.01) |

(52) U.S. Cl.
CPC ............. *G01R 31/58* (2020.01); *G01R 31/40* (2013.01); *H02H 3/093* (2013.01); *H02H 7/26* (2013.01); *G01R 31/085* (2013.01)

(58) Field of Classification Search
None
See application file for complete search history.

(56) References Cited

U.S. PATENT DOCUMENTS

| | | | | |
|---|---|---|---|---|
| 4,180,842 | A | * | 12/1979 | Keeney ................. H02H 3/027 361/85 |
| 4,188,573 | A | | 2/1980 | Gyugyi |
| 4,297,740 | A | | 10/1981 | Hagberg |
| 4,328,459 | A | * | 5/1982 | McLeod, Jr. ........... G05F 1/455 323/321 |
| 4,600,961 | A | | 7/1986 | Bishop |
| 4,812,995 | A | | 3/1989 | Girgis |

(Continued)

FOREIGN PATENT DOCUMENTS

WO    2014018909    1/2014

OTHER PUBLICATIONS

Abhisek Ukil "Detection of direction change in prefault current in current-only directional overcurrent protection," IECON 2016—42nd Annual Conference of the IEEE Industrial Electronics Society, Florence, Italy, Oct. 2016.

(Continued)

*Primary Examiner* — Stephen W Jackson
(74) *Attorney, Agent, or Firm* — Bradley W. Schield; Richard M. Edge

(57) ABSTRACT

An electronic device includes input circuitry that obtains an input signal. The electronic device includes processing circuitry that has an integrating memory dropout (IMD) timer. The IMD timer generates an extended output signal that is asserted an extended amount of time that varies based at least in part on integration of the received input signal.

19 Claims, 8 Drawing Sheets

(56) References Cited

U.S. PATENT DOCUMENTS

| | | | |
|---|---|---|---|
| 5,883,578 A | 3/1999 | Roberts | |
| 6,518,767 B1* | 2/2003 | Roberts | H02H 3/30 |
| | | | 324/521 |
| 6,573,726 B1 | 6/2003 | Roberts | |
| 6,721,671 B2 | 4/2004 | Roberts | |
| 6,833,711 B1 | 12/2004 | Hou | |
| 7,720,619 B2 | 5/2010 | Hou | |
| 7,945,400 B2 | 5/2011 | Hou | |
| 8,289,668 B2 | 10/2012 | Kasztenny | |
| 9,160,158 B2 | 10/2015 | Schweitzer | |
| 9,250,282 B2 | 2/2016 | Ukil | |
| 9,366,715 B2 | 6/2016 | Ukil | |
| 9,413,156 B2 | 8/2016 | O'Brien | |
| 9,568,516 B2 | 2/2017 | Gubba Ravikumar | |
| 10,340,684 B2 | 7/2019 | Sridharan | |
| 2005/0057212 A1 | 3/2005 | Harbaugh | |
| 2005/0231871 A1 | 10/2005 | Karimi | |
| 2005/0288884 A1 | 12/2005 | Sutrave | |
| 2007/0055889 A1 | 3/2007 | Henneberry | |
| 2008/0158750 A1 | 7/2008 | Premerlani | |
| 2008/0211511 A1 | 9/2008 | Choi | |
| 2009/0009180 A1 | 1/2009 | Varghai | |
| 2011/0006123 A1* | 1/2011 | Sharp | F24F 11/30 |
| | | | 236/49.3 |
| 2011/0035065 A1 | 2/2011 | Schweitzer | |
| 2011/0075304 A1 | 3/2011 | Hamer | |
| 2012/0068717 A1 | 3/2012 | Gong | |
| 2012/0330582 A1 | 12/2012 | Wiszniewski | |
| 2013/0107405 A1 | 5/2013 | Blumschein | |
| 2013/0221977 A1 | 8/2013 | Ukil | |
| 2014/0028116 A1 | 1/2014 | O'Brien | |
| 2014/0055280 A1* | 2/2014 | Iwahashi | H04W 4/20 |
| | | | 340/870.01 |
| 2014/0104735 A1 | 4/2014 | Vanhala | |
| 2015/0124358 A1 | 5/2015 | Hulse | |
| 2016/0041216 A1 | 2/2016 | Tang | |
| 2016/0091537 A1 | 3/2016 | Gaarder | |
| 2016/0266193 A1 | 9/2016 | Ennis | |
| 2016/0299187 A1 | 10/2016 | Liang | |
| 2016/0308349 A1 | 10/2016 | Sridharan | |
| 2019/0036954 A1* | 1/2019 | Garcia | H04L 63/20 |
| 2019/0317143 A1 | 10/2019 | Dase | |
| 2021/0063460 A1 | 3/2021 | Dase | |

OTHER PUBLICATIONS

M. M. Eissa, "Evaluation of a new current Directional Protection technique using field data," in IEEE Transactions on Power Delivery, vol. 20, No. 2, pp. 566-572, Apr. 2005.

A.K. Pradhan, "Fault Direction Estimation in Radial Distribution System Using Phase Change in Sequence Control", IEEE Transactions on Power Delivery; Oct. 2007, pp. 2065-2071 (Year:2007).

William O'Brien, et al. "Catching Falling Conductors in Midair—Detecting and Tripping Broken Distribution Circuit Conductors at Protection Speeds" Presented at the 42nd Annual Western Protective Relay Conference, Oct. 2015.

Abhisek Ukil, et al. "Current-Only Directional Overcurrent Protection for Distribution Automation: Challenges and Solutions", IEEE Transactions on Smart Grid vol. 3, Issue: 4, pp. 1687-1694, Dec. 2012.

Abhisek Ukil, et al. "Current-Only Directional Overcurrent Relay," in IEEE Sensors Journal, vol. 11, No. 6, pp. 1403-1404, Jun. 2011.

Abhisek Ukil, et al. "Smart distribution protection using current-only directional overcurrent relay," 2010 IEEE PES Innovative Smart Grid Technologies Conference Europe (ISGT Europe), Gothenberg, Oct. 2010, pp. 1-7.

Karl Zimmerman, "Improve Security for Carrier Holes on DCB Schemes Using SEL Distance Relays", SEL Application Guide vol. 1 AG96-12, Aug. 1997.

John J. Meinardi, Miriam P. Sanders, "Investigation and Analysis into the Mis-Operation due to Carrier Holes", Apr. 2008.

Zachary P. Campbell, Yiyan Xue, Ryan C. Dixon, "Power Line Carrier Directional Comparison Blocking Misoperation Event Analyses & Avoidance Techniques", Apr. 2013.

* cited by examiner

INTEGRATING MEMORY DROPOUT TIMER

RELATED APPLICATION

This application claims priority under 35 U.S.C. § 119(e) to U.S. Provisional Patent Application No. 63/071,444, filed Aug. 28, 2020, titled "Directional Comparison Blocking Scheme with Integrating Memory Dropout Timer," which is hereby incorporated by reference in its entirety.

TECHNICAL FIELD

The present disclosure generally relates to reliability of directional protection in power systems, and, more particularly, to a dropout timer that ensures proper blocking signals for directional protection in electric power delivery systems.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers (CBs), disconnects, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment. For example, IEDs, such as protective relays, may obtain electrical measurements that indicate the presence and/or location of a fault on a power line and perform a protective action to protect the power system upon the occurrence of a fault.

IEDs may communicate with each other to improve the protection of the power system. One technique in which communication may be used to improve protection is in directional comparison blocking (DCB) schemes that use the fault location with respect to the relay location (e.g., forward fault, reverse fault) and communicate blocking signals to a receiving IED to block the receiving IED from tripping. By blocking the receiving IED from tripping, the receiving IED may allow power to continue to be delivered to loads.

The blocking signal may be communicated as one or more bits of data over a communication channel (e.g., one or more wires). Disconnect switching operations and transients due to power system faults and breaker operations may cause carrier holes (CHs), which may cause issues in DCB schemes. In some applications, DCB schemes may use blocking signal extension timers with long dropout delays to maintain scheme security when the received blocking signal is interrupted because of CH occurrence. These long delays may increase fault clearance times when an internal line fault is preceded by an external fault or when there is a spurious assertion of the received signal because of noise in the communication channel before an internal fault occurs. These long delays also decrease scheme availability in noisy communication channel environments. One technique to address CH occurrences is to use multiple timers with different pickup and dropout delays in parallel. However, the use of multiple timers may increase complexity and use additional IED hardware and/or software resources.

Figure 1:
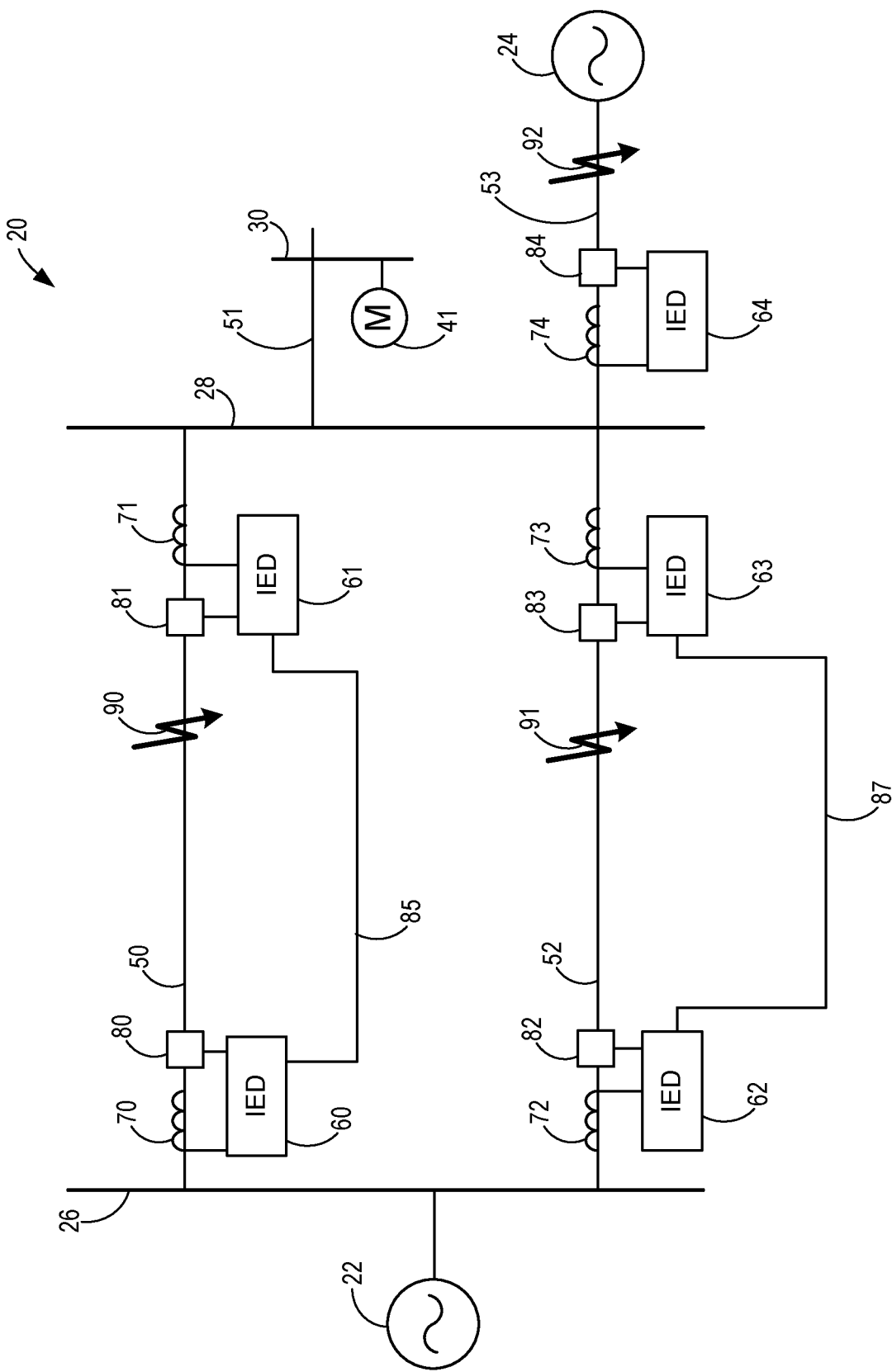
FIG. 1 illustrates a one-line diagram of an electric power delivery system that includes intelligent electronic devices (IEDs) that monitor the electric power delivery system for fault events and communicate blocking signals in a directional comparison blocking (DCB) scheme, in accordance with an embodiment.

As explained below, an integrating memory dropout (IMD) timer may be used to improve security of DCB schemes by reducing or eliminating the effects of CH occurrences on the communication channel. Further, the IMD timer may use fewer timers of the IED than setting different delays in parallel, while improving resolution, by varying the dropout time based on integration of a received blocking signal. By using fewer timers of the IED, the complexity of DCB scheme may be reduced. Further, on IEDs that use hardware-based timers, the hardware of the timers that are used for the DCB scheme may be re-allocated to other processes, thereby improving the functionality of the IED FIG. 1 illustrates a one-line diagram of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system 20 includes a first power source 22 and a second power source 24 and buses 26, 28, and 30. The power sources 22 and 24 may be any suitable power sources, such as distributed generators. The electric power delivery system 20 may include loads, such as load 41, that consume power from the first power source 22 and the second power source 24. The electric power delivery system 20 includes power lines 50-53 that communicatively couple the first power source 22 and the second power source 24 to deliver power to the loads. Although illustrated in single-line form for purposes of simplicity, the electric power delivery system 20 may be part of a larger multi-phase system, such as a three-phase electric power delivery system.

The electric power delivery system 20 may be protected by one or more electronic devices, such as intelligent electronic devices (IEDs) 60-64. As used herein, an IED (such as IEDs 60-64) may refer to any microprocessor-based device that monitors, controls, automates, and/or protects monitored equipment within the electric power delivery system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IEDs 60-64 may obtain electric measurements (e.g., current and/or voltage measurements) via analog signals from sensors 70-74, such as current transformers (CTs), potential transformers (PTs), Rogowski coils, voltage dividers, or the like. In other embodiments, the IEDs 60-64 may obtain digitized analog signals from merging units, which obtain electrical signals from the power system and communicate the digitized analog signals to the IEDs 60-64.

The IEDs 60-64 may be communicatively connected to circuit breakers (CBs) 80-84 to perform protection and/or control operations on the electric power delivery system 20. For example, the IEDs 60-64 may detect currents, via the sensors 70-74, that exceed a threshold current indicating that a fault has occurred on the electric power delivery systems 20. Upon detecting a fault, the IEDs 60-64 may send a trip signal to the CB 80-84, thereby isolating the fault from the remaining electric power delivery system 20.

The IEDs 60-63 may communicate power system data with each other to improve protection of the power system via communication lines 85 and 87. For instance, the IEDs 60-63 may determine the location of a fault 90-92, such as the direction, distance, and/or zone of the fault 90-92 based on the power system measurements. For example, the IEDs 60-63 may use phase differences between voltages and currents to determine the direction of the fault (e.g., either forward or reverse) with respect to the IED The IEDs 60-63 may communicate the fault location information to other IEDs to perform protection operations that isolate the fault while continuing to provide electric power to the remaining electric power delivery system 20.

In DCB schemes, the IED 61 may identify the fault direction as being a reverse fault 91 and/or 92 using the voltage and/or current measurements. If the fault is in the reverse direction, the IED 61 may communicate a blocking signal (e.g., logical 1) to the IED 60, indicating that the IED 60 cannot trip the circuit breaker 80 upon detecting fault conditions, thereby preventing IED 60 misoperation for a fault external to line 50 from the electric power delivery system 20. Conversely, the IED 61 may identify the fault as being in a forward direction 90. The IED 60 may communicate an unasserted blocking signal (e.g., logical 0) to the IED 60 indicating that the IED 60 can trip the CB 80 if the IED 60 detects the fault in the forward direction. That is, the IEDs may determine the fault direction as being forward or reverse and communicate blocking signals depending on the fault direction. By blocking the IED 60 from tripping CB 80 when the fault is an external fault via communication of assertion of the blocking signal, the line 50 may continue to be connected to the system 20 while the fault is isolated/cleared by the IEDs 62 and 63, or IED 64. By communicating unasserted blocking signals (e.g., logical 0), the IEDs 60-61 send trip signals to the corresponding CBs 80-81 when the fault is an internal fault, and the load 41 and lines 51, 52 and 53 may continue to be connected to system 20 while the fault is isolated/cleared. Although IEDs 60 and 61 are used above as an example, this is meant to be illustrative, and the same or similar operations may be performed by IEDs 62 and 63.

Figure 2:
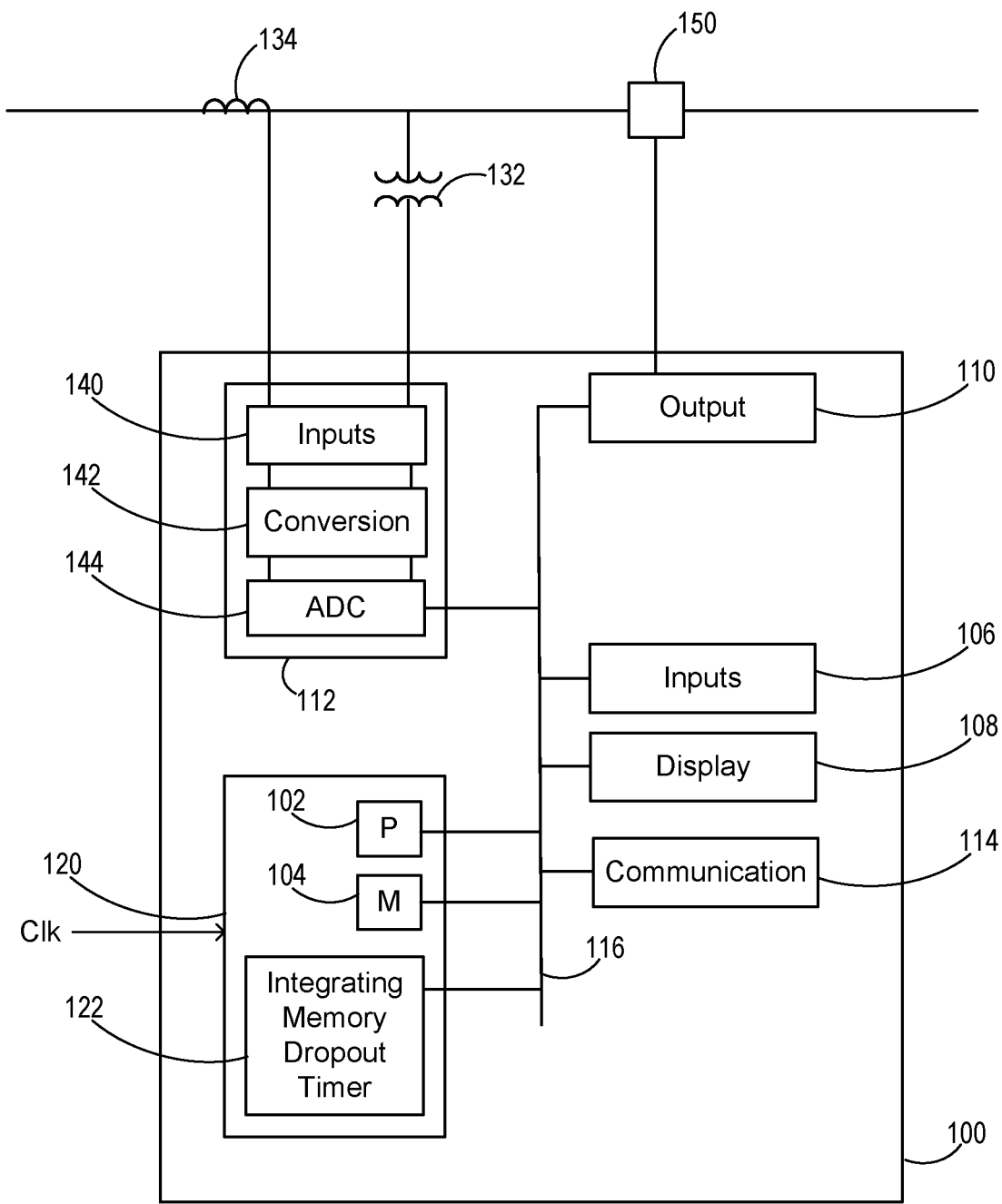
FIG. 2 is a block diagram of an example of an IED that generates an extended blocking signal from a received blocking signal using an integrated memory dropout (IMD) timer to improve reliability of the DCB scheme in the electric power delivery system of FIG. 1, in accordance with an embodiment.

FIG. 2 is a block diagram of an IED 100 that uses an IMD timer, in accordance with an embodiment. The IED 100 may be an example of any of the IEDs 60-64 of FIG. 1. The IED 100 includes one or more processor(s) 102, a computer-readable storage medium 104, input structures 106, a display 108, output circuitry 110, sensor circuitry 112, and communication circuitry 114. The IED 100 may include one or more bus(es) 116 connecting the processor 102 or processing unit(s) to the computer-readable storage medium 104, the input structures 106, the display 108, the output circuitry 110, the sensor circuitry 112, the communication circuitry 114, and an IMD timer 122. The computer-readable storage medium 104 may be embodied as memory, such as random access memory (RAM), read only memory (ROM), or a combination thereof, and may include or interface with software, hardware, or firmware modules for implementing various portions of the systems and methods described herein. The computer-readable storage medium 104 may be the repository of one or more modules and/or executable instructions configured to implement any of the processes described herein.

The processor 102 may process inputs received via the sensor circuitry 112 and the communication circuitry 114. The processor 102 may operate using any number of processing rates and architectures. The processor 102 may be configured to perform various algorithms and calculations described herein using computer executable instructions stored on computer-readable storage medium 104. The processor 102 may be embodied as a microprocessor. In certain embodiments, the processor 102 and/or the computer-readable storage medium 104 may be embodied as discrete electrical components, a general purpose integrated circuit, one or more Application Specific Integrated Circuits ("ASICs"), a Field Programmable Gate Array ("FPGA"), and/or other programmable logic devices.

As illustrated, the sensor circuitry 112 may include, for example, input pins 140 or connectors that receive voltage signal(s) and current signal(s) from voltage sensors (e.g., potential transformers (PTs) 132), current sensors (e.g., current transformers (CTs) 134), and the like. The sensor circuitry 112 may transform the current and voltage signals using conversion circuits 142 to a level that may be measured and sample the signals using, for example, A/D converter(s) 144 to produce digital signals representative of measured voltage and measured current on the power line. The A/D converter 144 may be connected to the processor 102 by way of the bus 116, through which digitized representations of voltage signals may be transmitted to the processor 102. The processor 102 may send signals to trip the circuit breaker (CB) 150 depending on the electrical conditions of the power line and/or the communication signals from other IEDs.

The communication circuitry 114 may include communication ports, such as ethernet ports, serial ports, and/or fiber optic ports. Further, the communication circuitry 114 may include a transceiver to communicate with one or more electronic devices, such as the other IEDs 60-64 in the power system 20 of FIG. 1. The sensor circuitry 112, the communication circuitry 114, and any other inputs to the IED 100 and/or processor 102 may be generally referred to as input circuitry.

The IED 100 may include a display screen 108 that displays information to notify an operator of operating parameters of the electric power delivery system 20, such as current measurements, voltage measurements, power measurements, etc. The input structures 106 may include buttons, controls, universal serial bus (USB) ports, or the like, to allow a user to provide inputs into the IED 100. In some embodiments, the display 108 and input structures 106 may be a touchscreen display.

As mentioned above, the IED 100 may obtain a received signal, such as a received blocking signal, from another IED on the power system over the communication medium (e.g., one or more wires) via the communication circuitry 114. The received blocking signal may have CHs caused by electromagnetic waves from disconnect switching operations and transients due to power system faults. That is, CHs may change the receiving IED 60 to receive a blocking signal that is unasserted when the IED 61 attempted to communicate an asserted signal.

In some embodiments, such as those on FPGAs, the IED 100 may include processing circuitry 120 having the processor 102, the computer-readable storage medium 104, and other hardware on a fabric of the FPGA. For example, the IMD timer 122 may be implemented in hardware on the fabric of the FPGA via logic circuits using a hardware description language (HDL). As an example, the IMD timer 122 may be implemented using a single timer (e.g., single hardware register) that decrements a counter (i.e., a dropout time) of the register each clock cycle of a clock of the FPGA. The hardware register of the IMD timer 122 may be set with a dropout time based upon integration of the received blocking signal. Setting the dropout time may be performed in hardware, software via the execution of instructions by the processor 102, or a combination thereof.

While the systems and processes are described in conjunction with DCB schemes, note that any suitable application of an IMD timer may be used. Further, note that while a received blocking signal is used as an example of an input signal for integration, any suitable input signal may be used with an IMD timer to generate an extended signal that is based on integration of the input signal.

Figure 3:
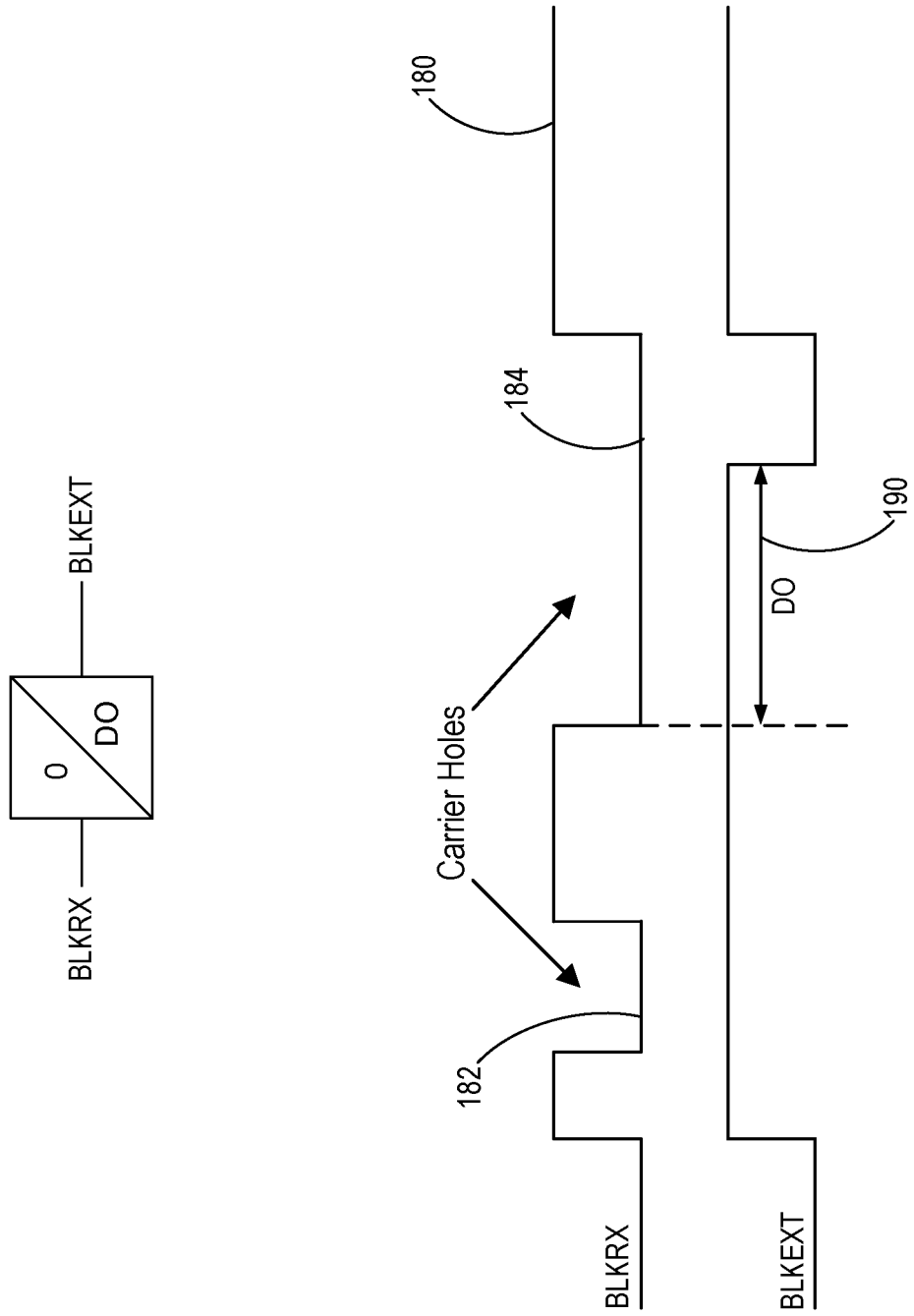
FIG. 3 is a timing diagram of a timer with a fixed dropout delay from receiving a blocking signal with carrier holes (CHs), in accordance with an embodiment.

FIG. 3 is a timing diagram of a timer with constant dropout delay illustrating a received blocking signal (BLKRX) 180 that may be received by the IED 100. The received blocking signal includes a first CH 182 and a second CH 184. When the received blocking signal is asserted (i.e., logical 1), then the IED 100 may wait to trip the CB 150 while an external fault is cleared on the power delivery system 20. Due to the CHs, the IED 100 may trip the CB 150 because the received blocking signal is unasserted (i.e., logical 0) indicating that the IED 100 is allowed to trip the CB 150. One technique to prevent tripping from CHs may involve the IED generating an extended blocking signal (BLKEXT) with a fixed timer of a set time period 190. However, the second CH 184 with a longer duration than the timer dropout delay may cause an IED to trip the CB 150 undesirably when the timer drops out while an external fault is present.

Figure 4:
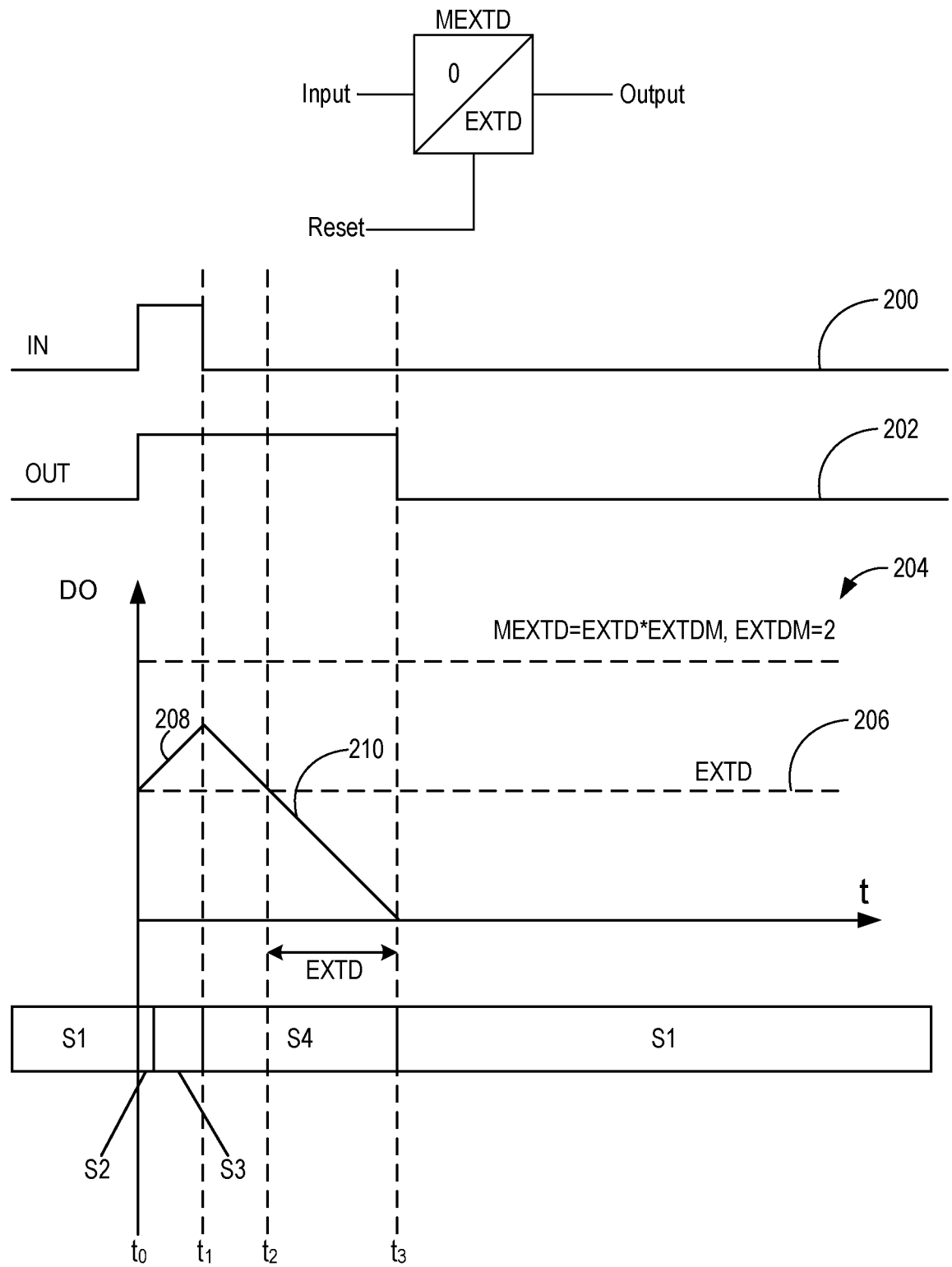
FIG. 4 is a timing diagram of the extended blocking signal that may be generated by the IED of FIG. 2 based on a dropout time of the IMD timer, in accordance with an embodiment.

FIG. 4 is a timing diagram of the IED 100 that uses the IMD timer 122 to integrate the BLKRX signal 200. The dropout delay of the IMD timer 122 depends on the duration of the assertion of the received blocking signal; the longer the received blocking signal is asserted, the longer the IMD timer 122 maintains the dropout delay.

That is, the IMD timer 122 adjusts the dropout delay depending on how long the input is asserted. The IMD timer 122 may begin with a predetermined minimum dropout delay upon assertion of the received blocking signal (IN) and increase the delay up to a predetermined maximum value when the input remains asserted. The timer configuration settings may be received via the input structures 106 and may include an extended dropout delay value (EXTD) (e.g., 0.0, 0.1, . . . , 1000 ms) and an extended dropout delay multiplier (EXTDM) (e.g., 1, 2, . . . , 10) where EXTD and EXTDM determine the maximum extension delay (MEXTD) as:

$$MEXTD = EXTD \cdot EXTDM \tag{1}$$

As illustrated in FIG. 4, the received blocking signal (IN) 200 is asserted for a time period less than (MEXTD−EXTD) with EXTDM set as 2. Upon assertion of the received blocking signal 200 at time $t_0$, the IMD timer 122 is set to the minimum extended dropout delay value 206. While the received blocking signal is asserted between times $t_0$ and $t_1$, the IMD timer 122 integrates the received blocking signal causing the dropout timer to increase linearly (line 208).

When the received blocking signal 200 transitions to being unasserted at time $t_1$, the IMD timer 122 counts the dropout time down (line 210) causing the dropout timer to decrease linearly. The IMD timer 122 counts down an amount of time that varies proportionally to the amount of time the received blocking signal 200 is asserted. In the illustrated embodiment, the IMD timer 122 counts down an amount of time between $t_1$ and $t_3$ that is approximately equal to the time between to and $t_1$ (as indicated by the time between $t_1$ and $t_2$) plus the EXTD time (as indicated by the time between $t_2$ and $t_3$). When the IMD timer 122 expires at time $t_3$, the IED 100 may stop asserting the extended blocking signal (OUT) 202. When the extended blocking signal 202 is asserted, the IED 100 prevents the trip the CB 150 when an external fault is present on the power delivery system 20.

Figure 5:
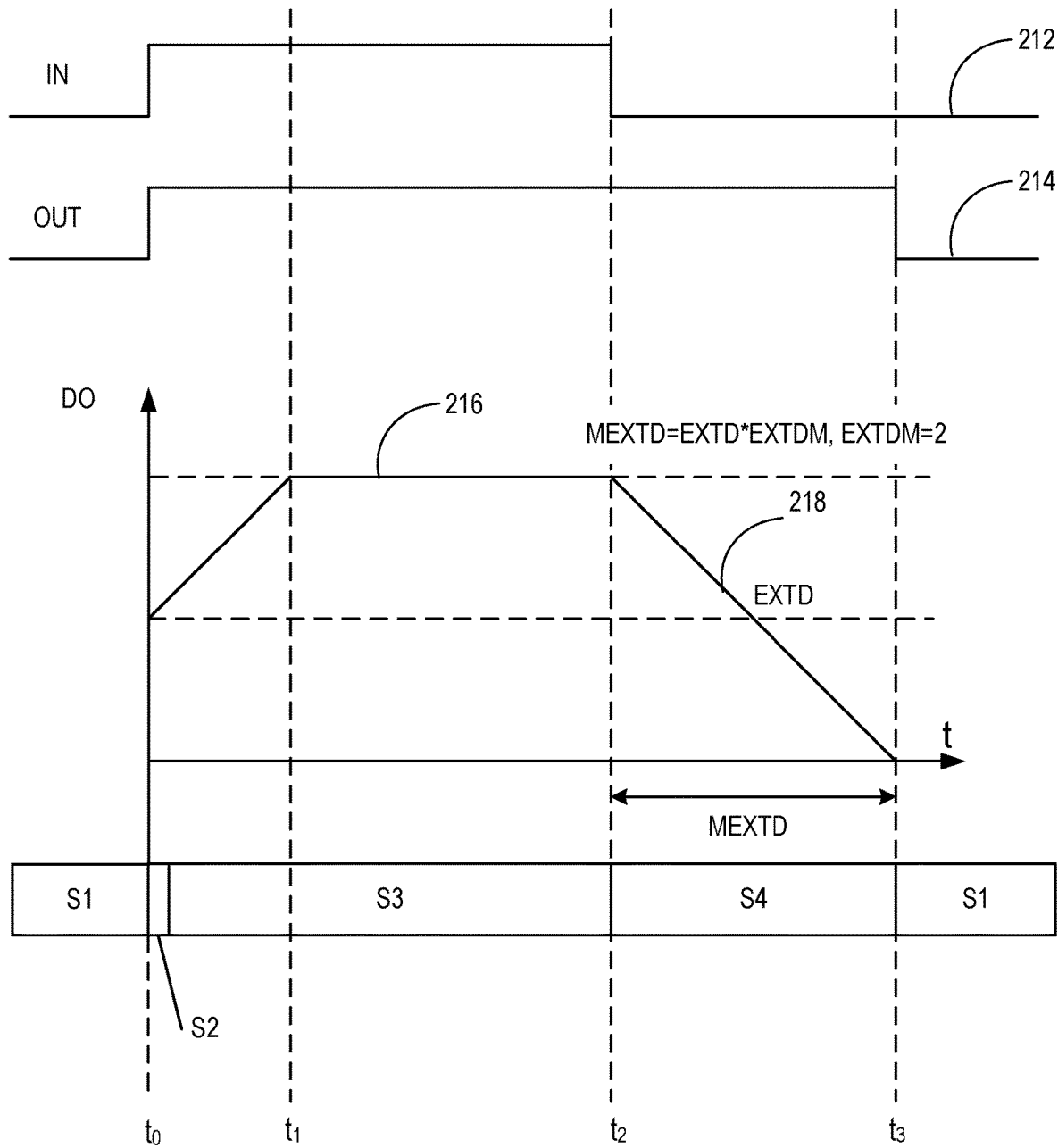
FIG. 5 is a timing diagram of the extended blocking signal that may be generated by the IED of FIG. 2 based on a dropout time in which a maximum extension delay is reached, in accordance with an embodiment.

FIG. 5 is a timing diagram in which the received blocking signal 212 is asserted for a time period greater than MEXTD. The IMD timer 122 may increase the dropout time until, at time $t_1$, the MEXTD time is reached. The IMD timer 122 may maintain the dropout time as being set at the MEXTD while the received blocking signal 212 continues to be asserted (line 216). When the received blocking signal 212 is unasserted due to CHs, the IED 100 may continue assertion of the extended blocking signal 214 for the MEXTD time (as indicated between times t2 and t3) while the dropout time decreases (line 218). The EXTD, EXTDM, and/or the MEXTD values may be set by the user depending on the implementation and the expected potential CHs that may occur.

Figure 6:
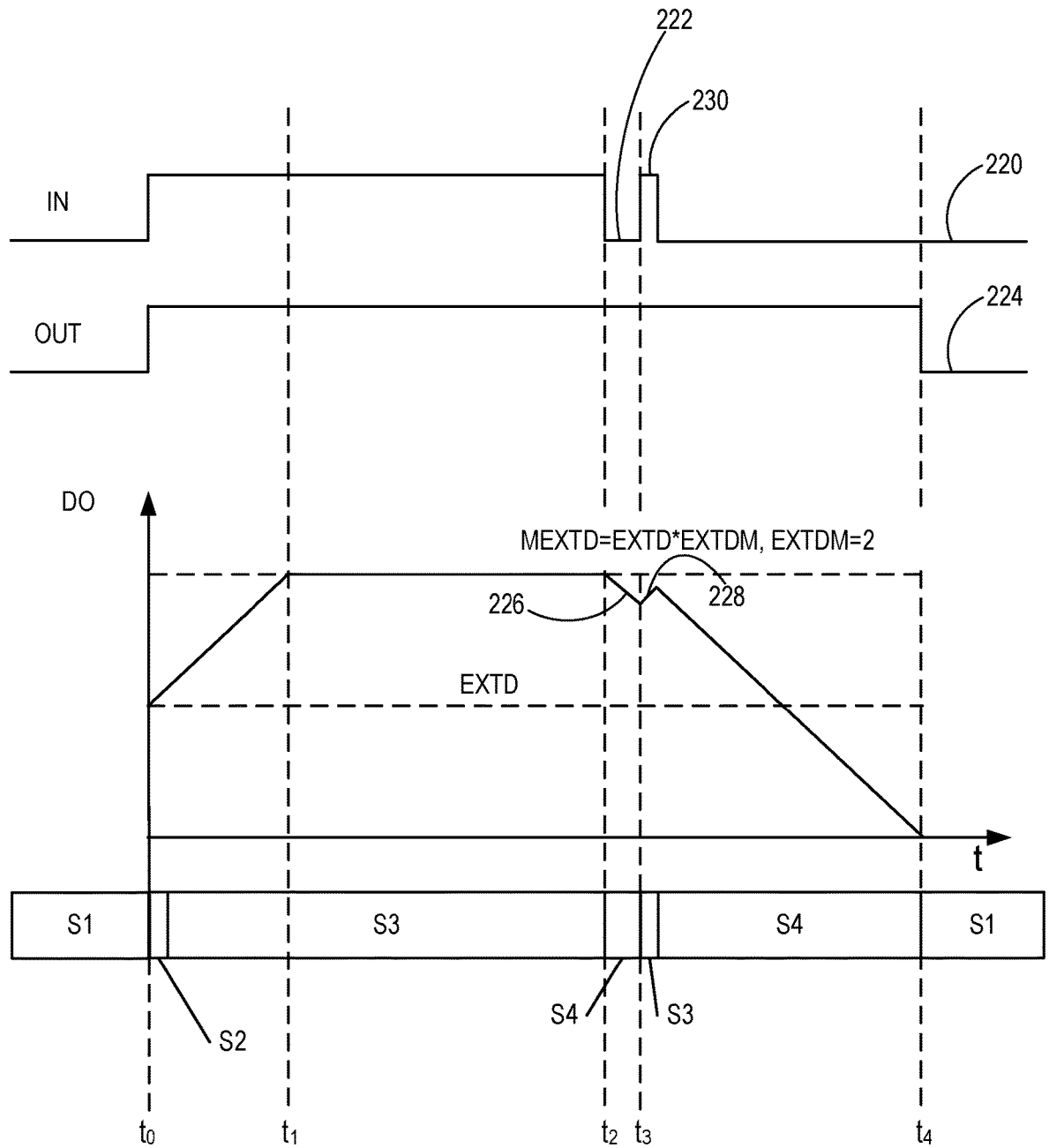
FIG. 6 is another timing diagram of the extended blocking signal that may be generated by the IED of FIG. 2 based on a dropout time in which a maximum extension delay is reached and a CH occurs, in accordance with an embodiment.

FIG. 6 is another timing diagram that illustrates a received blocking signal 220 with a CH 222 between times $t_2$ and $t_3$. That is, at time $t_2$, the IMD timer 122 counts down while the received blocking signal 220 is unasserted due to the CH 222. At time $t_3$, the IMD timer 122 increases an amount proportional to the remaining asserted portion 230 of the received blocking signal due to integration of the remaining asserted portion 230. As illustrated, the extended blocking signal 224 remains asserted during the CH 222. When the remaining asserted portion 230 of the received blocking signal 220 ends, IMD timer 122 counts the dropout time down until expiration resulting in assertion of the extended blocking signal 224 ending at time $t_4$.

Figure 7:
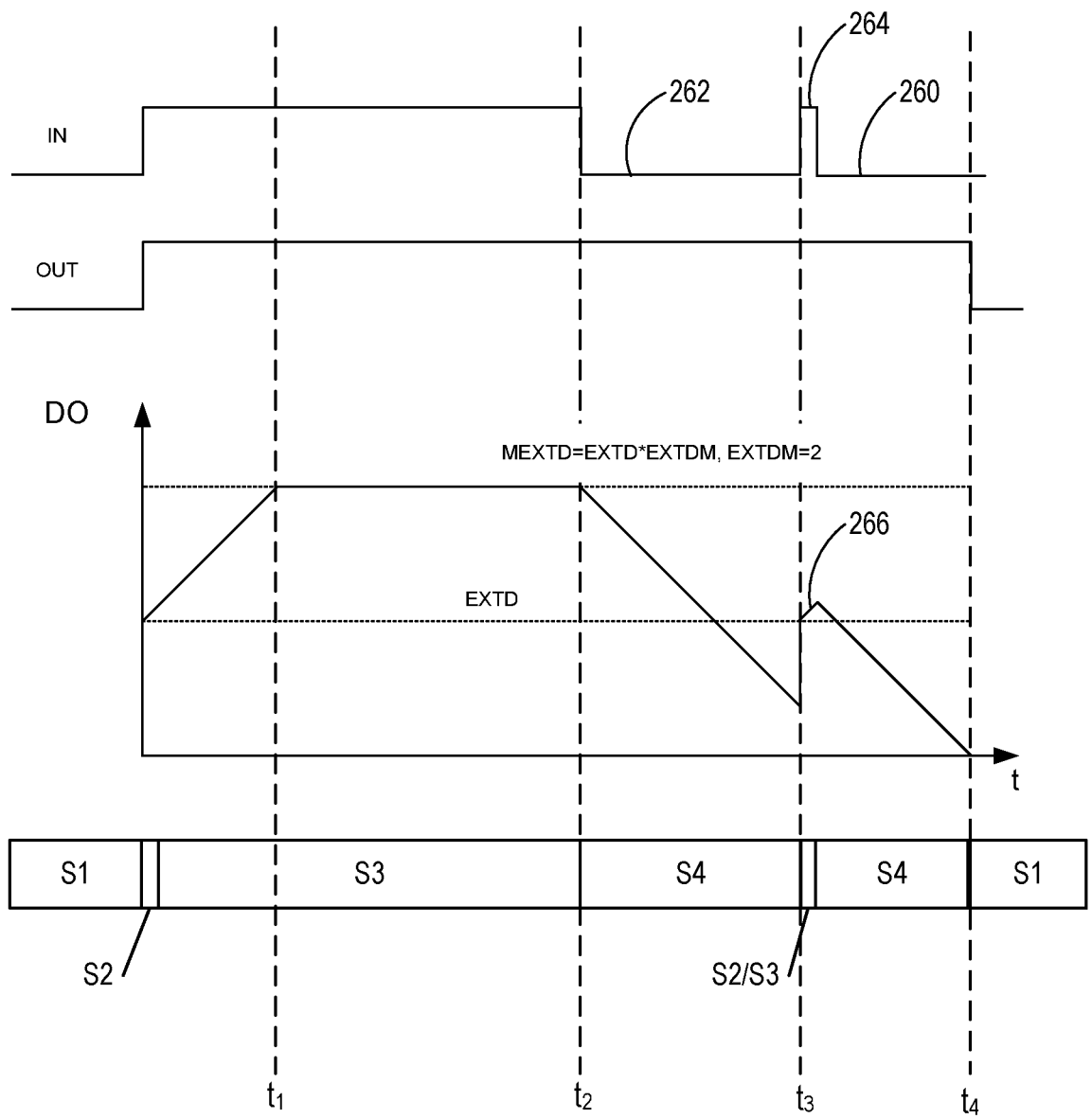
FIG. 7 is a timing diagram of the extended blocking signal that may be generated by the IED of FIG. 2 in which a CH occurs after reaching the maximum extension delay and lasts until the dropout time falls below an extended dropout delay, in accordance with an embodiment.

FIG. 7 is a timing diagram that illustrates a received blocking signal 260 with a CH 262. As illustrated, the received blocking signal 260 is asserted for longer than MEXTD-EXTD and reasserted while timing to drop out and the dropout time DO<EXTD with EXTDM set to 2. That is, the CH 262 causes the dropout time to fall below the extended dropout delay value between $t_2$ and $t_3$. When the received blocking signal 260 is reasserted, at time $t_3$, from the remaining asserted portion 264, the IMD timer 122 may reset the dropout time to EXTD. The IMD timer 122 may continue integrating the received blocking signal causing the dropout time to increase (line 266). When the received blocking signal 260 remains unasserted following the remaining asserted portion 264, the dropout time DO may expire. Following expiration of the dropout time, the IED 100 may perform protection tripping operations during a fault event.

Figure 8:
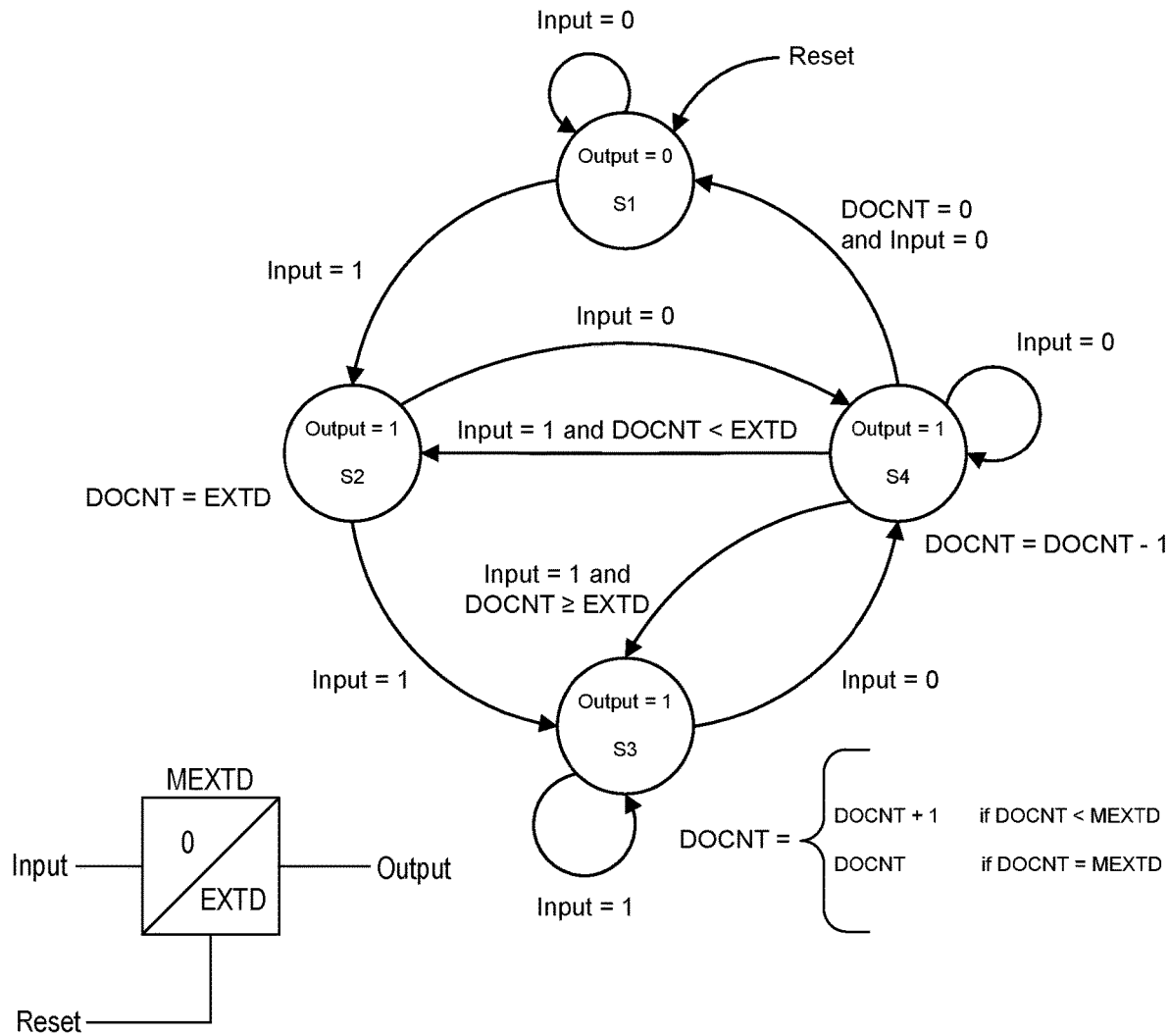
FIG. 8 is a state diagram of the extended blocking signal that may be used by the IED of FIG. 2 to implement the IMD timer, in accordance with an embodiment.

FIG. 8 is a state diagram of the IMD timer 122 that may be used to perform the processes described herein. As mentioned above, the process may be stored as instructions in the memory 104 and executed by the processor 102 of the IED 100, in hardware of the IED 100, or a combination thereof. At S1 (e.g., upon reset), the IED 100 may wait to receive assertion of the received blocking signal to transition to S2. At S2 when the received blocking signal is asserted, the dropout time (DOCNT) may be set to EXTD and the extended blocking signal may be asserted. When the received blocking signal remains asserted, the IMD timer 122 may transition to state S3. While the received blocking signal continues to be asserted at S3, the dropout time may be incremented (i.e., increased from a previous dropout time) or, upon reaching MEXTD, the dropout time may continue to be set to MEXTD. When the received blocking signal is unasserted from S2 or S3, the IMD timer 122 may transition to S4. At S4, the dropout time may be decremented while the received blocking signal is unasserted. If the received blocking signal is asserted again, the IMD timer 122 may transition to S2 when the dropout time is below EXTD and transition to S3 when the dropout time is greater than or equal to EXTD. When the dropout time expires and the received blocking signal remains unasserted, the IMD timer 122 may return to S1 and the extended blocking signal may transition to being unasserted to allow for protection operations to be performed by the IED 100. FIGS. 4-7 include the states listed in conjunction with the timing diagrams.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device, comprising:
input circuitry configured to obtain an input signal; and
processing circuitry comprising an integrating memory dropout (IMD) timer, wherein the IMD timer is configured to:
set a dropout time by integrating the input signal over time and set an output of the IMD timer based on expiration of the IMD timer; and
generate an extended signal that is asserted an extended amount of time that varies based at least in part on the integration of the input signal.

2. The electronic device of claim 1, wherein the processing circuitry comprises a clock, wherein the processing circuitry is configured to count down from the dropout time when the input signal is unasserted by decrementing a counter via one or more clock cycles of the clock.

3. The electronic device of claim 2, wherein the IMD timer is configured to increase the dropout time when the input signal is asserted.

4. The electronic device of claim 2, wherein the IMD timer is implemented on a single hardware timer on a fabric of a field-programmable gate array (FPGA) in the IED.

5. The electronic device of claim 1, wherein the input signal is a received blocking signal that is asserted to block a protection operation of the IED, and wherein the extended signal is an extended blocking signal that is asserted the extended amount of time to cause the electronic device to prevent a protection operation of the IED until expiration of the IMD timer.

6. The electronic device of claim 5, wherein the processing circuitry is configured to:
detect presence of a fault on a power line of an electric power delivery system; and
send a trip signal to trip a circuit breaker (CB) when the extended blocking signal is unasserted and the fault is present on the power line and to block sending the trip signal when the extended blocking signal is asserted as part of a directional comparison blocking (DCB) scheme of the electric power delivery system.

7. The electronic device of claim 1, wherein the processing circuitry is configured to increase a dropout time to a maximum extension delay and to continue setting the dropout time to the maximum extension delay when the maximum extension delay is reached and the input signal continues to be asserted.

8. The electronic device of claim 1, wherein the extended signal is unasserted upon expiration of the dropout time indicating that the IED is allowed to perform a protection operation on an electric power delivery system.

9. The electronic device of claim 1, wherein the processing circuitry is configured to, upon reassertion of the input signal, setting the extended signal to an extended delay value when the dropout timer is below the extended delay value and increasing a dropout time from a previous dropout time when the dropout timer is greater than the extended delay value.

10. A method, comprising:
obtaining an input signal;
setting, via processing circuitry, an integrating memory dropout (IMD) timer with a dropout time to expire at an extended amount of time longer than the input signal is asserted, wherein the extended amount of time varies based at least in part on integration of the input signal;

waiting, via the processing circuitry, until the IMD timer expires; and performing, via the processing circuitry, an operation upon expiration of the IMD timer.

11. The method of claim 10, comprising:

receiving a configuration setting of an extended dropout delay; and receiving a configuration setting of an extended dropout delay multiplier;

wherein the maximum extension delay of the extended signal is the extended dropout delay times the extended dropout delay multiplier.

12. The method of claim 11, comprising, upon reassertion of the input signal, setting the dropout time to the extended dropout delay when the dropout time is below the extended dropout delay and increasing the dropout time from an immediately preceding previous dropout time when the dropout timer is greater than the extended dropout delay value.

13. The method of claim 11, wherein the input signal is a received blocking signal that is a part of a directional comparison blocking (DCB) scheme in which the electronic device isolates a fault when the direction of the fault is identified as a forward direction and the received blocking signal is unasserted, and wherein the electronic device is blocked from tripping a circuit breaker of the electronic device from assertion of the received blocking signal when the fault is external to the protected equipment.

14. The method of claim 10, wherein the processing circuitry is configured to count down from the dropout time when the input signal is unasserted.

15. A system, comprising:

a first IED configured to:
   obtain first electrical measurements of a power line;
   detect a fault on the power line based on the first electrical measurements;
   determine a location of the fault based on the first electrical measurements; and
   send a blocking signal;

a second IED configured to:
   receive the blocking signal from the first IED;
   set an integrating memory dropout (IMD) timer with a dropout time based at least in part on integration of the blocking signal;
   generate an extended blocking signal that is asserted based on the dropout time of the IMD timer.

16. The system of claim 15, wherein the second IED is configured to set the dropout time as a sum of a predetermined extended dropout delay and a duration of assertion of the blocking signal received from the first IED up to a maximum value determined by the product of a predetermined extended dropout delay and an extended delay multiplier.

17. The system of claim 15, wherein the first IED and the second IED are a part of a directional comparison blocking (DCB) scheme, and wherein the first IED is configured to detect a fault as being in a reverse direction with respect to the fault location and to communicate the blocking signal as asserted to the second IED to block the second IED from tripping a circuit breaker while the fault external to the power line is cleared.

18. The system of claim 15, wherein the dropout time increases linearly while the blocking signal is asserted and decreases linearly while the blocking signal is unasserted.

19. The system of claim 15, wherein the second IED is configured to increase a duration of assertion of the extended blocking signal to a maximum extension delay and to continue setting the extended blocking signal to the maximum extension delay when the maximum extension delay is reached.

* * * * *